METHOD OF PREPARING AT LEAST ONE CONDUCTIVE FORM

Filed Dec. 10, 1970 3 Sheets-Sheet 1

INVENTORS
M. A. DeANGELO
D. J. SHARP
By J. Rosenstock
ATTORNEY

April 24, 1973 M. A. DE ANGELO ET AL 3,729,388

METHOD OF PREPARING AT LEAST ONE CONDUCTIVE FORM

Filed Dec. 10, 1970 3 Sheets-Sheet 2

April 24, 1973 M. A. DE ANGELO ET AL 3,729,388

METHOD OF PREPARING AT LEAST ONE CONDUCTIVE FORM

Filed Dec. 10, 1970 3 Sheets-Sheet 3

United States Patent Office 3,729,388
Patented Apr. 24, 1973

3,729,388

METHOD OF PREPARING AT LEAST ONE CONDUCTIVE FORM

Michael Anthony De Angelo, Hamilton Township, Mercer County, and Donald Jex Sharp, Lawrence Township, Mercer County, N.J., assignors to Western Electric Company, Incorporated, New York, N.Y.

Filed Dec. 10, 1970, Ser. No. 96,945
Int. Cl. C23b *7/08, 5/48;* B01k *1/00*
U.S. Cl. 204—3 44 Claims

ABSTRACT OF THE DISCLOSURE

A method of preparing conductive patterns comprises depositing a thin metallic form or pattern on a base material comprising a valve metal. The valve metal base with the deposited pattern thereon is then subjected to an electrolytic plating treatment in which only the pattern and not the base is electroplated and built up to a desired thickness. A background support or substrate, having at least one surface rendered adhesive, may then be contacted with the built-up pattern at the adhesive surface. Pressure is then maintained along the substrate sufficient to (1) insure the subsequent removal of the pattern from the base when the substrate is removed from contact therewith and (2) insure the temporary retention of the patterns on the substrate. The retention of the patterns may then be rendered permanent.

BACKGROUND OF THE INVENTION

(1) Field of the invention

This invention relates to a method of preparing at least one conductive form, and more particularly to preparing at least one discrete conductive form on a substrate.

(2) Description of the prior art

Heretofore, the building up of discrete conductive forms or patterns on various insulative bases, e.g., in the formation of printed circuits, has been done by various electroplating techniques. One technique is to suitably mask and electroless plate the thin metallic patterns on a stainless steel substrate. The thin metallic patterns are then contacted with a tacky, sticky or adhesive surface of an insulative base material and delaminated or peeled off from the stainles steel substrate, thereby resulting in very thin electroless plated metallic patterns on the insulative base material. The problem then encountered however, is the difficulty of simultaneously electroplating upon all of the discrete conductive patterns to build them up to the desired thickness. The desired thickness cannot conveniently be attained through the electroless process due to the slow rate of deposition and the cost thereof. If a vapor deposition technique is employed, again the desired thickness cannot be economically attained. Various techniques using interconnections (destined to be later etched away) between discrete patterns or using a multiplicity of leads to the various discrete patterns, have been employed to connect all the discrete patterns to a cathode during electrodeposition. However, these techniques are tedious, time consuming, add additional steps and are, therefore, costly.

If the electroless pattern is to be built up on a stainless steel substrate, prior to the delamination or the peeling off of the metallic pattern by the tacky insulative base, suitable masking is required during the electrodeposition. If suitable masking is not provided, the stainless steel substrate, which acts as the cathode, would also become electroplated with the deposited metal thereby leading to unwanted conductive regions which could be delaminated along with the desired patterns.

In the electroforming of many articles, stainless steel mandrels are employed and the resultant electroformed article is peeled directly off the mandrel. However, for many of these articles, particularly in the electroforming of screens and grids, additional processing steps are required which add to the costs thereof. In particular, a stainless steel sheet is coated with a photosensitive resist which is exposed and developed in a desired grid pattern. Unexposed portions of the resist are washed away, baring the stainless steel in these areas. The bare stainless steel is then etched to form recesses, whereafter the developed resist is removed. The entire stainless steel surface is coated with a "stop-off" plastic material, i.e., a material which prevents electrodeposition. The plastic material is cured and the stainless steel surface is machined to remove the plastic from the unetched areas and leave the etched portions filled. Electrodeposition is then carried out on the stainless steel sheet or mandrel whereby the plastic filled recessed portions act as a "stop-off." An electroformed grid is built up with holes of the appropriate size and shape.

A process whereby conductive patterns, forms or articles can be deposited and built up to the desired thickness without employing masking procedures or the other abovementioned techniques is therefore desired and in demand.

SUMMARY OF THE INVENTION

The present invention is directed to a method of preparing at least one conductive form, and more particularly, to preparing at least one discrete conductive form on a substrate. The method comprises selecting a suitable base comprising a material capable of conducting the electrical current needed for electrodeposition, but which is passive to electrodeposition, i.e., the metallic species to be subsequently electroplated from a suitable electroplating bath does not plate out on the material. Such a suitable base material has been found to be a valve metal selected from the group consisting of tantalum, niobium, molybdenum and tungsten. Deposited upon the valve metal base, through electroless plating or any other technique known in the art, is at least one discrete, thin metallic pattern or form. The valve metal base containing or supporting at least one thin, discrete pattern or form is immersed in a suitable electroplating bath containing a suitably selected anode. The valve metal base is charged cathodically with respect to the anode and a sufficient current density is maintained within the bath whereby only the discrete conductive patterns or forms are plated and built up to the desired thickness.

The discrete conductive patterns or forms have poor adhesion on the valve metal base and therefore can be removed therefrom rather easily. The conductive forms or patterns may be removed manually, i.e., just lifted from the valve metal base or in the alternative, a suitable substrate or background support may be selected and employed to remove the patterns or forms.

A suitable substrate or background support is any material, whose surface can be maintained in a tacky, sticky or adhesive condition either through heat or chemical treatment of the substrate surface itself or by the coating of the substrate surface with a second material, which may be a permanent or temporary adhesive or cement. The substrate, with at least one tacky or adhesive surface, contacts the top surface areas of the built-up forms or patterns supported on the valve metal base. The contacting is maintained at a pressure sufficient to (1) insure the subsequent removal of the discrete built-up patterns from the valve metal base when the substrate is removed from contact therewith, and (2) insure the retention, either permanent or temporary, of the discrete patterns on the contacting surface, after the substrate is removed from the base, thereby forming discrete metallic patterns on a suitable background support, which in the case of printed circuit configurations is an insulative substrate member.

The method is one which optimizes the preparation by (1) eliminating the necessity for a multiplicity of cathodic leads to each discrete pattern, (2) eliminating the necessity for interconnections between each conductive pattern, which interconnections are destined for subsequent removal, (3) depositing each discrete conductive form or pattern on a base material which is capable of acting as a cathode during subsequent electrodeposition build-up but which is passivated from the electrodeposition upon its own surfaces, i.e., there is no metal plating on the surfaces of the base material but only on the discrete conductive regions contained thereon, and (4) eliminating the need for masking the cathode, whereby all the surface areas of the deposited-base material can be exposed to the plating solution during the subsequent electrodeposition build-up operations.

DESCRIPTION OF THE DRAWINGS

The present invention will be more readily understood by reference to the following drawings taken in conjunction with the detailed description wherein.

DETAILED DESCRIPTION

The present invention is described primarily in terms of the electrodeposition of metallic copper employing cathodes of tantalum, niobium, molybdenum and tungsten. However, it will be understood that such description is exemplary only and is for purposes of exposition and not for purposes of limitation. It will be readily appreciated that the inventive concept described is equally applicable to the valve metal cathodes which are chemically compatible, i.e., which do not undergo chemical interaction, with a particular electrolytic plating solution to be employed to achieve the electrodeposition of a particular metal desired, which metal is not limited to copper alone.

Figures 1, 2:
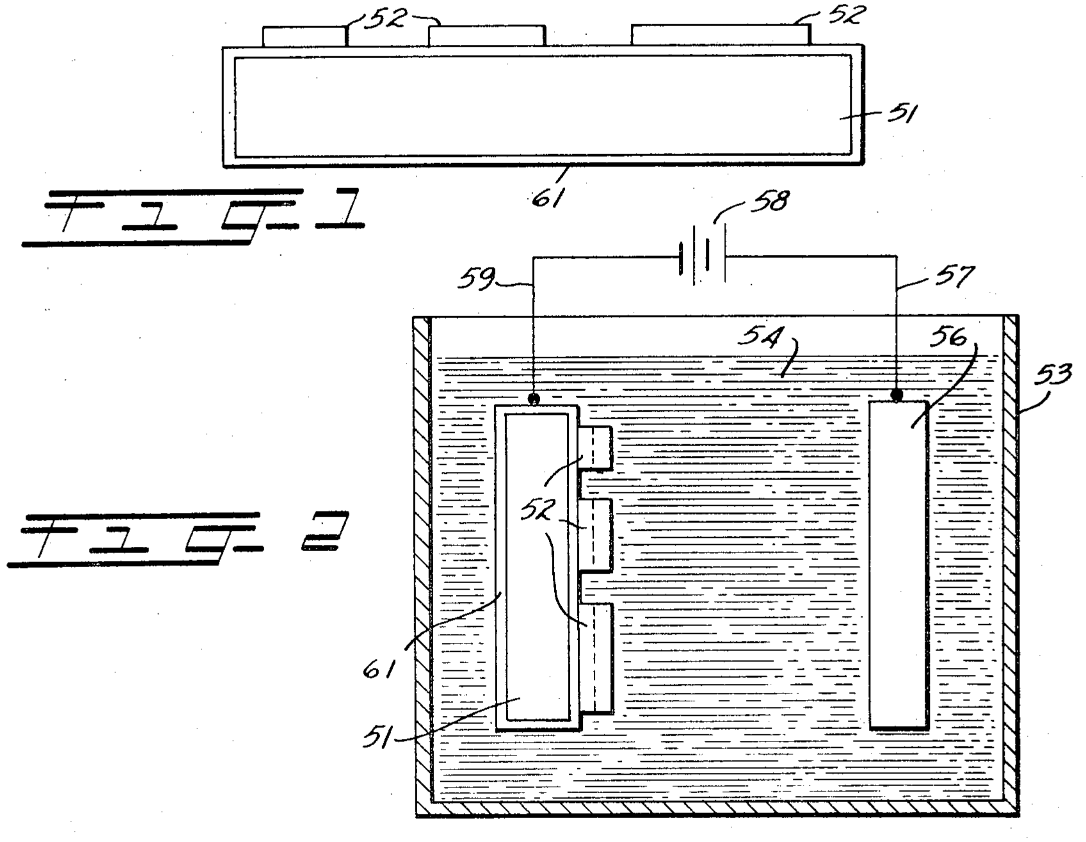
FIG. 1 is a cross sectional view of a valve metal base which has thin discrete conductive patterns deposited thereon.
FIG. 2 is a cross-sectional view of a plating apparatus employed with the novel inventive method during the metal plating build-up of the discrete conductive patterns of FIG. 1.

With reference now to FIG. 1, there is shown a suitable base member 51. A suitable base member is one comprising a material, e.g., tantalum, which will conduct electricity while acting as a cathode in a plating solution, but which is inert or passivated towards the electroplating action of the plating solution to which the base 51 is destined to be subjected. The terms inert or passivated mean that the material does not become metal plated under the conditions to be employed for electroplating a metal, e.g., copper, onto discrete conductive patterns or forms which are destined to be niobium, molybdenum and tungsten which are deposited upon and supported by the base 51. Suitable materials other than tantalum have been found to be metals selected from the group of metals known as the valve metals. The term "valve metals" denotes a group of metals, as described by L. Young, Anodic Oxide Films, Academic Press Inc., 1961, at page 4, having as a fundamental characteristic property the tendency to form a protective high-electrical-resistance oxide film on anodic polarization to the exclusion of all other electrode processes. In general, any metal can be employed and classified as a valve metal which forms oxide films on its surface which behave quite analogously to those formed on tantalum. The valve metals selected are those which (1) are capable of forming protective oxides of good electrical integrity, i.e., are those valve metals which form good resistors, (2) are chemically compatible with the particular plating solutions to be employed, i.e., the valve metals and/or their oxides are not soluble to any great extent in the plating medium and (3) have oxides which are self-regenerating, i.e., are those valve metals which will spontaneously form oxides when exposed to air or oxygen.

It is to be understood that any valve metal meeting the above criteria may be employed. It is also to be understood that a combination of the designated valve metals, e.g., an alloy thereof, may be employed as the base member material. It is finally to be understood that a combination of at least one suitable valve metal, i.e., tantalum, niobium, molybdenum and tungsten and at least one other selected metal can be combined, e.g., in alloy form, and employed as the base member material. Preferably, the valve metal group is a major constituent of the combination or alloy, i.e., there is at least approximately 30 weight percent of the valve metal present, depending on the metal type. In this regard, selected metals are those metals which are (1) chemically compatible with the selected valve metals and (2) chemically compatible with the electrolytic plating solution employed.

Formed on at least one surface of the valve metal base 51 are discrete thin conductive patterns or forms 52, e.g., copper. It is, of course, understood that the patterns or forms may be of any shape and configuration and that although a plurality of forms have been illustrated, there may be only one form or pattern. The patterns 52 may be formed thereon through the electroless plating method disclosed in the application of M. A. De Angelo et al., Ser. No. 719,976, filed Apr. 9, 1968, and now Pat. No. 3,562,005, and assigned to the assignee hereof. It should be noted that electroless plating via this method, cannot be readily achieved on stainless steel, a material widely used in delamination processes. It should also be noted that in the alternative, the patterns 52 may be formed through standard masking and electroless plating, evaporative techniques or other metal depositing techniques well known in the art.

The discrete forms or patterns 52 are destined to be subjected to an electroplating treatment in order to build up the thickness of these patterns 52. Referring to FIG. 2, a suitable inert container 53 is selected. A suitable container is one which is nonconductive and which will not react with the electroplating bath reagents destined to be contained therein. Contained within container 53 is a metal electroplating solution 54, such as for example, a standard copper acid sulfate, acid fluoroborate, alkaline cyanide or alkaline Rochelle cyanide solution. It should be noted that the electroplating solution selected depends upon the metal desired to be plated out, the chemical compatability of the plating solution with the metallic patterns 52 and the chemical compatability of the plating solution with the valve metal base 51, selected and destined to be charged and employed as a cathode. The above requirements are those which are well known or can be easily ascertained experimentally by those skilled in the electrochemical art.

Housed within container 53 is a suitable anode 56, e.g., a copper anode, which is connected by a suitable means 57 to the positive pole of a constant voltage source 58, e.g., a battery.

The unmasked base 51 with its bare surface areas and the discrete patterns 52, contained or supported on at least one surface area thereof, is exposed to or immersed in the electroplating bath or solution 54 and is connected by suitable means 59 to the negative pole of the voltage source 58, whereby the base 51 acts as a cathode. It should be stressed at this point that unlike other prior art methods, the cathodic base 51 need not be masked so as to protect it from deposition upon its surfaces since the valve metal base 51 is passivated to electrodeposition thereupon. Therefore, all surface areas of the cathodic base 51 and the discrete forms or patterns 51 can be exposed to the electroplating ambient. It is to be noted at this point, that it has been known to be quite difficult to electroplate a valve group metal, e.g., tantalum. It is surprising, however, to find that one can metal plate a conductive form or pattern, e.g., copper, in contact with a valve metal without having electrodeposition upon the valve metal.

A sufficient current density is maintained within solution 54 whereby the metal, e.g., copper, is selectively electroplated only upon the discrete patterns 52 and not upon the valve metal cathode, i.e., base 51. The electroplating is continued until the desired build-up or thickness is achieved. For a tantalum cathode base element, employed in the electrodeposition of copper, the maximum current density which can be employed without observing passivation breakdown of the tantalum cathode, with resultant copper plating thereupon, has been found to be 250 amps per square foot of the surface area of the pattern being plated upon.

In FIGS. 1 and 2 a cross section of the valve metal base 51 is shown. A desirable valve metal, e.g., tantalum, niobium, etc., naturally occurring, has an oxide film 61 which covers its surface areas. This naturally occurring oxide film 61 ranges from 5 to 20 A. in thickness for tantalum at 25° C. It is hypothesized that this oxide film passivates the base, i.e., prevents it from becoming plated while functioning as the cathode during electrodeposition. Therefore, for the particular valve metal base 51, employed as the cathode, the plating bath 54 selected should be one which will not attack this oxide coating 61 and thereby lead to deposition on the cathodically charged base 51.

A valve metal which has the tendency to form such a natural oxide coating 61, i.e., an oxide coating formed spontaneously upon the exposure of the valve metal to air or oxygen, is, of course, desirable. However, thermally or electrically formed oxides may perform the same functions as naturally formed oxide, therefore, a valve metal may be further anodized prior to its use as a cathode to build up the natural oxide layer or to form an oxide layer and thereby improve the working capabilities of the valve metal base cathode 51. It has been found, in the case of tantalum, that the tantalum cathode can have a maximum oxide layer equivalent to a 100 volt-oxide film [10–20 A./volt] whereafter its contact efficiency starts to decrease, when employed with a standard copper plating bath.

After the patterns 52 have been sufficiently built up to the desired thickness, typically, in the case of copper patterns on a tantalum base, having a minimum ranging from 5,000 to 10,000 A., the unmasked base 51 is removed from the plating bath 54. The built-up patterns 52 may be removed manually, i.e., by simply lifting the patterns 52 from the base 51 or alternatively, referring to FIG. 3, a suitable substrate or background support 62 is selected. Suitable supports or substrates 62 may be any material whose surface can be maintained in a tacky, sticky or adhesive condition. Included in this class of substrate, but not to be restricted thereby, may be metals, wood, glasses, plastics, ceramics and cloth. Where a printed circuit is to be fabricated, the substrate 62 may either be a nonconductor, i.e., a dielectric material or it may be a conductive material, e.g., a metal, which has been suitably coated with a dielectric adhesive-type material thereby rendering the surfaces of the metal adhesive.

The selected substrate 62 is coated on at least one surface with a suitable coating material to form an adhesive or sticky surface layer 63. A suitable coating material may be temporary adhesive materials such as, for example, waxes (beeswax) which act as suitable adhesives at room temperature but lose their adhering qualities at higher temperatures. In the alternative, the coating material may be permanent adhesives such as thermosetting resins, e.g., phenolic or rubber resin compositions, well known in the art, which upon heating become heat settable. It is, of course, understood that where the substrate selected is capable of having its surfaces rendered tacky or adhesive through physical or chemical treatment alone, the use of a coating material is not necessary to obtain the adhesive surface 63. Typical substrates of this type are those resins or plastics, known in the art, which can be rendered tacky by heat or solvent action. Typically, the tacky surface layer 63 must retain sufficient tack when exposed to air for a period of time, of up to half an hour or more, to provide proper adhesion of the built-up patterns 52 destined to be contacted therewith.

The suitable substrate 62 having at least one tacky or adhesive contact surface 63 is placed upon the built-up patterns 52 supported on base 51 so that the top surface areas of the patterns 52 contact the tacky surface 63 of substrate 62. A sufficient pressure is maintained on the substrate 62 along its entire length whereby the top surface areas of the patterns 52 are slightly imbedded into the tacky surface 63. A sufficient pressure is one which will (1) insure the subsequent removal of the patterns 52 from the base 51 when the substrate or background support 62 is removed from contact therewith and (2) insure the temporary retention of the patterns 52 on the surface 63 of the substrate 62.

Figure 4:
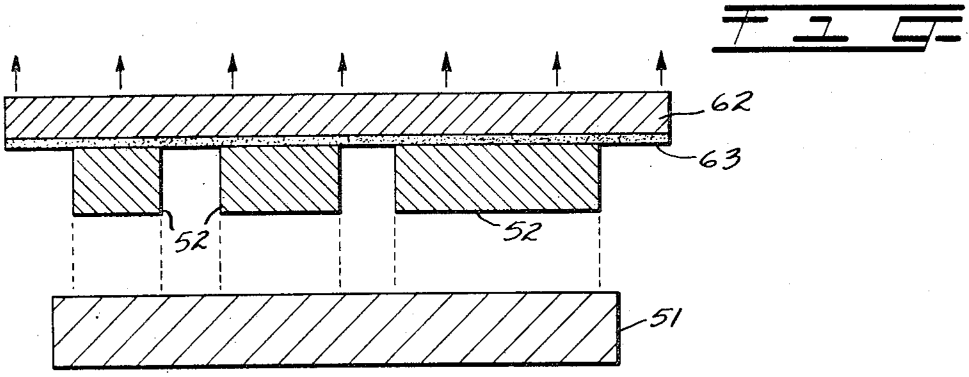
FIG. 4 is a cross-sectional view of the background support of substrate of FIG. 3 after removing the built-up patterns from the valve metal base and retaining the patterns on its contacting surface.

Referring to FIG. 4, the substrate 62 is then lifted upward and away from the base 51, whereby the patterns 52 are removed from the valve metal base 51 and are temporarily retained on the contact surface 63 of the insulative substrate member 62. Permanent retention, if necessary, of the patterns may then be accomplished by one of several known techniques including the application of pressure alone, of the combination of heat and pressure, or generally any suitable treatment or curing step known in the art to remove the tacky condition of the substrate 62. It should be noted here that the patterns 52 poorly adhere to the valve metal base 51. This poor adhesion allows the above-described transfer or delamination to take place. It should also be noted that the delamination steps described above may, of course, be reversed, i.e., the base 51 with its patterns 52 may be placed atop the substrate 62 and the base 51 may subsequently be lifted upward and away from the substrate 62 to achieve the delamination.

In an alternative embodiment of the present invention, intricate metallic patterns or articles may be electroformed employing mandrels which do not have to be (1) masked during electroless deposition, (2) etched prior to the electroforming and (3) masked during the actual electroforming or electrodeposition.

Figures 5, 6, 7:
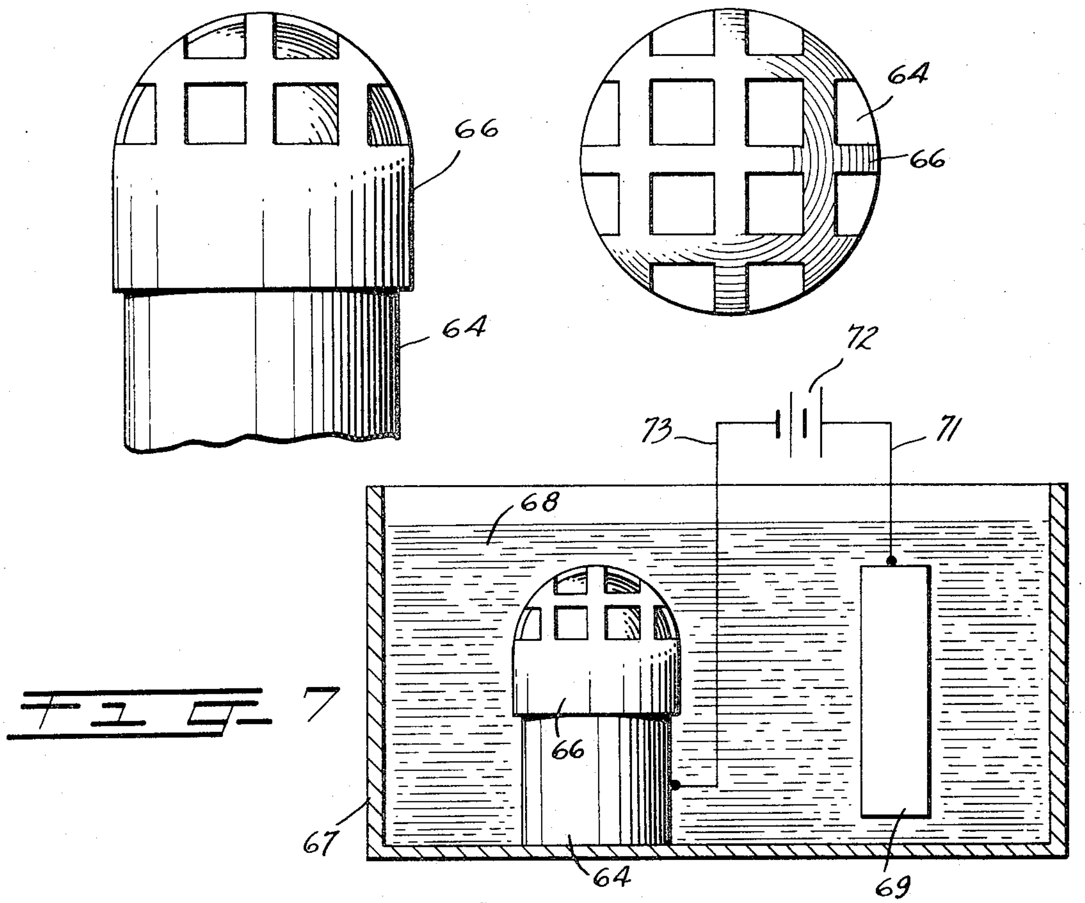
FIG. 5 is a cross-sectional view of a valve metal mandrel which has a thin conductive pattern deposited thereon.
FIG. 6 is a plan view of the conductive pattern-deposited mandrel of FIG. 5.
FIG. 7 is a cross-sectional view of a plating apparatus of the invention during the electroforming operation upon the deposited mandrel of FIG. 5.

With reference now to FIG. 5, there is shown a suitable base member or mandrel 64. A suitable base or mandrel 64 is one comprising a material, e.g., tantalum, which will conduct electricity and acts as a cathode in a plating solution, but which is inert or passivated towards the electroplating action of the plating solution to which the mandrel 64 is destined to be subjected. In other words, the material does not become metal plated under the conditions to be employed for electroplating a metal, e.g., copper, onto a thin metallic coat which is destined to be deposited upon and supported by the mandrel or base 64. Suitable materials other than tantalum have been found, as discussed above, to be the valve metals niobium, molybdenum and tungsten group. As discussed above, any valve metal may be used as the cathode in metal plating provided that it is compatible with the particular plating bath selected.

Formed on the mandrel 64 is a thin conductive form or coating 66, conforming to the general shape of the mandrel 64 and the detail of the article desired as shown in FIG. 6. The metallic coat or form 66 may be formed thereon through the electroless plating method disclosed in the application of M. A. De Angelo et al. Ser. No. 719,976, filed Apr. 9, 1968 and now Pat. No. 3,562,005, and assigned to the assignee hereof. It should be noted that in the alternative, the form 66 may be formed through standard masking and electroless plating or evaporative techniques well known in the art.

The form or coat 66 is destined to be subjected to an electroplating treatment in order to build up the thickness of the coat 66. Referring to FIG. 7, a suitable inert container 67 is selected, i.e., a container which is dielectric and which will not react with the electroplating bath reagents destined to be contained therein. Contained within the container 67 is a metal plating solution 68 such as, for example, a standard copper acid sulfate, acid fluoborate, alkaline cyanide or alkaline Rochelle cyanide solution. Again, it should be noted that the electroplating solution selected depends upon the metal desired to be plated out, the chemical compatability of the plating solution with the metallic pattern or form 66 and the chemical compatability of the plating solution 68 with the valve metal mandrel 66, selected and destined to be charged and employed as a cathode. The above requirements are those which are well known or can be easily ascertained experimentally by those skilled in the electrochemical art. Housed within container 67 is a suitable anode 69, e.g., a copper anode, which is connected by suitable means 71 to the positive pole of a constant voltage source 72, e.g., a battery.

The unmasked valve metal mandrel 64 with its bare surface areas and the metallic article form 66, contained or supported thereon, is exposed or immersed in the electroplating bath 68 and is connected by suitable means 73 to the negative pole of the voltage source 72, whereby the mandrel 64 acts as a cathode. It should again be stressed at this point that unlike other prior art electroforming methods, the cathodic mandrel 64 need not be masked so as to protect it from deposition upon its surfaces, since the valve metal mandrel 64 is passivated to electrodeposition thereupon, and therefore, all surface areas of the cathodic mandrel 64 and pattern 66 can be exposed to the electroplating ambient. A sufficient current density is maintained within solution 68 whereby the metal, e.g., copper, is electroplated only upon form 66 and not upon the valve metal cathodic mandrel 64. The electroplating is continued until the desired build-up or thickness is achieved. For a tantalum cathode, employed in the electrodeposition of copper, the maximum current density which can be employed without getting passivation breakdown of the tantalum cathode, with resultant copper plating thereupon, has been found to be 250 amps per square foot of the surface area of the pattern being plated upon.

Again, as discussed above, the valve metals, e.g., tantalum, niobium, etc., have a natural oxide film which cover their surface areas and which film has been hypothesized as passivating the valve metal cathodes from electrodeposition. Therefore, for the particular valve metal mandrel, employed as the cathode, the plating bath selected should be one which will not attack the oxide coating and thereby lead to deposition on the cathodically charged mandrel 64. Again, since the natural oxide coating has been hypothesized to be the passivating agent and since thermally or electrically formed oxides may perform the same functions as naturally formed oxide, a valve metal mandrel may be further anodized prior to its use as a cathode to build up the natural oxide layer or to form an oxide layer and thereby improve the working capabilities of the valve metal mandrel cathode 64. It has been found, in the case of tantalum, that the tantalum cathode can have a maximum oxide layer of 100 volt-oxide film [10–20 A./volt] whereafter its contact efficiency starts to decrease when employed with a conventional copper plating bath.

Figure 8:
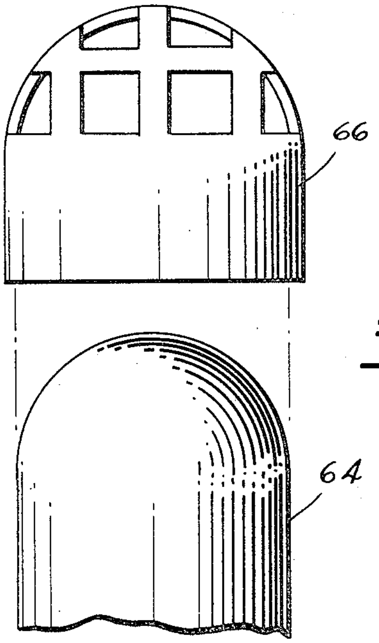
FIG. 8 is a cross-sectional view of the electroformed article after its removal from the mandrel of FIG. 5.

After the form 66 has been sufficiently built up to the desired thickness, typically, in the case of a copper form on a tantalum mandrel, having minimum ranging from 5,000 to 10,000 A., the unmasked mandrel 64 is removed from the plating bath 68. Referring to FIG. 8, the article form 66 of the desired thickness, is then removed, either manually or through any other means known in the art, from the mandrel 64 thereby yielding the desired article 66.

EXAMPLE I

Figure 9:
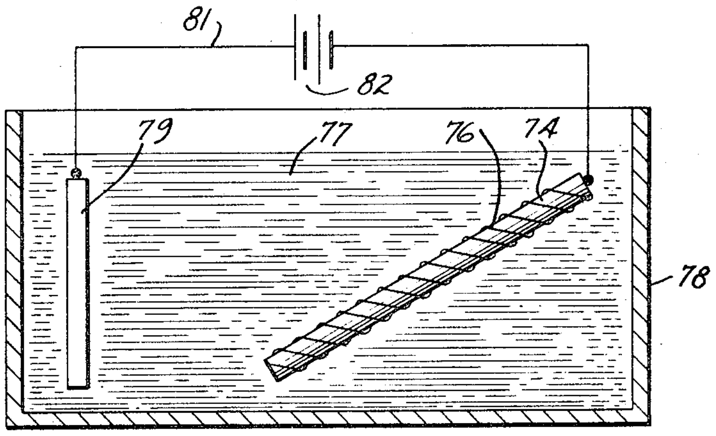
FIG. 9 is a cross-sectional view of an electrolytic plating bath containing a valve metal cathode situated therein to simulate a Hull cell, having incorporated therein the inventive method of FIG. 2.

Referring to FIG. 9, a cathode 74 was selected which comprised tantalum (99.9%). The tantalum cathode 74 was chemically polished with a cleaning solution comprising two parts by volume, $HNO_3$, two parts by volume $H_2SO_4$, and one part by volume HF. A 0.020 inch diameter copper wire 76 was wound around the polished tantalum cathode 74 which had an oxide layer thereon. The wire was wound in intimate contact with the cathode 74. The wire 76 was spaced 0.125 inch between windings and the total length of the copper wire 76 was 105 inches.

A plating solution 77, commercially obtained and consisting of 50%, by weight, $Cu(BF_4)_2$, 5%, by weight, fluoboric acid, and 50%, by weight, of deionized water was placed in a suitable polytetrafluoroethylene container 78. A copper anode 79 was selected and immersed in the plating solution 77 and attached by suitable means 81 to the positive pole of a battery 82. The tantalum cathode 74 with the wire 76 wound therearound was immersed in the solution 77 and maintained therein so as to form a simulated Hull cell, i.e., a cell wherein a wide current density range is obtained by the geometric arrangement of the cathode.

The temperature of the solution 77 was maintained at 30° C. and a constant current of 5 amps was passed into the solution 77 for a time period of 15 minutes. Copper metal was deposited only upon the copper wire 76 in contact with the tantalum cathode 74. There was no deposit upon the tantalum cathode 74 itself adjacent to areas of the wire 76 having a current density of 250 amps per square foot.

EXAMPLE II

The apparatus and procedures of Example I was repeated except that the cathode 74 comprises niobium (99.9%) having an oxide layer thereof thereon. Also the copper wire 76 had a total length of 12 inches and the current passed into solution 77 was 0.428 amp.

Copper metal was deposited only upon the copper wire 76 in contact with the niobium cathode 74. There was no deposition upon the niobium cathode 74 itself adjacent to areas of the wire 76 having a current density of 200 amps per square foot.

EXAMPLE III

The apparatus and procedure of Example I was repeated except that the cathode 74 comprised molybdenum (99.5%) having an oxide layer thereof thereon. Also the copper wire 76 had a total length of 12 inches and the current passed into solution 77 was 0.171 amp. Copper metal was deposited only upon the copper wire 76 in contact with the molybdenum cathode 74. There was no deposition upon the molybdenum cathode 74 itself adjacent to areas of the wire 76 having a current density of 80 amps per square foot.

EXAMPLE IV

The apparatus and procedure of Example I was repeated except that the cathode 74 comprised tungsten (99.5%) having an oxide layer thereof thereon. Also, the copper wire 76 had a total length of 7 inches and the current passed into solution 77 was 0.085 amp. Copper metal was deposited only upon the copper wire 76 in contact with the tungsten cathode 74. There was no deposition upon the tungsten cathode 74 itself adjacent to areas of the wire 76 having a current density of 68 amps per square foot.

EXAMPLE V

Figure 10:
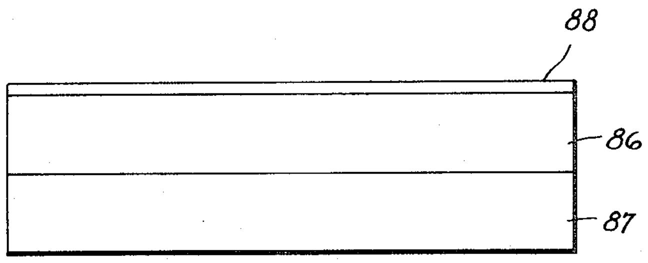
FIG. 10 is a cross-sectional view of an exemplary tantalum base having a copper pattern deposited thereon.

A tantalum base 84 illustrated in FIG. 10 was prepared. The base 84 consisted of a 2,000 A. tantalum layer 86 on a glass layer 87. The tantalum was sputtered on the glass layer 87 by standard methods known in the art. The base 84 was dipped in a 2%, by weight, HF acid solution for 5 minutes and then rinsed with deionized water.

Figure 11:
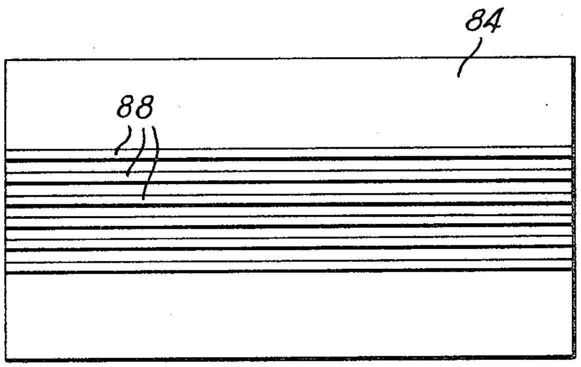
FIG. 11 is a plan view of the tantalum base of FIG. 10 with the copper pattern thereon.

The procedure revealed in M. A. De Angelo et al., Ser. No. 719,976, filed Apr. 9, 1968 and now Pat. No. 3,562,-005, was then followed, i.e., the surface of base 84 was first sensitized with 1%, by weight, $SnCl_2$ solution. The sensitized base 84 was then rinsed in deionized water for one minute and then selectively exposed to ultraviolet light to produce a pattern of a photopromoter salt capable of reducing a precious metal. The sensitized base 84 was then rinsed in deionized water for one minute and then selectively exposed in a pattern by exposure to ultraviolet light for one minute. The exposed base 84 was then immersed in a 0.01 molar aqueous $PdCl_2$ solution for 30 seconds to form a Pd coating on the tantalum base 84. The palladium-coated tantalum base 84 was then immersed in an autocatalytic copper electroless plating bath, commercially obtained, to produce discrete 200 A. thick conductive patterns of copper metal 88, the plan view of which is illustrated in FIG. 11.

The base 84 with the copper-deposited patterns 88 was then immersed in a 48%, by weight, copper fluoborate plating solution, commercially obtained. Affixed to the unmasked base 84 at the tantalum layer 86 was a lead from the negative pole of a battery. A copper anode was immersed in the bath and the bath was maintained at a temperature of 25° C. and a current density of 10 amps/ft.$^2$ whereby the copper patterns 68 were selectively built-up or copper plated to a thickness of 10,000 A.

Figure 3:
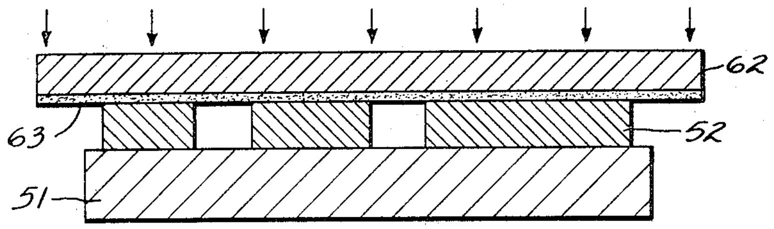
FIG. 3 is a cross-sectional view of a background support or substrate in contact with the built-up discrete patterns of FIG. 2 supported on the valve metal base.
Figure 12:
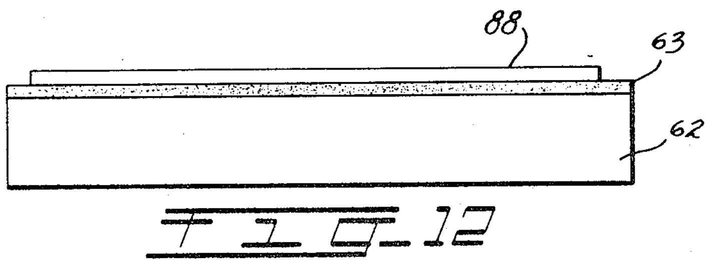
FIG. 12 is a cross-sectional view of the delaminated copper pattern of FIG. 10 on a background support.

A background support having one surface rendered tacky or adhesive, similar to that described in FIG. 3, was selected. The background support 62 with its accompanying adhesive surface 63 was commercially obtained and comprised a cellophane backing or support 62 on which was deposited an adhesive layer 63 comprising a synthetic rubber resin adhesive. The built-up copper patterns 88 were then contacted with the tacky adhesive surface 63 in a fashion similar to that described in FIG. 4. Sufficient pressure was applied along the length of the cellophane 62 so that the patterns 88 were removed from the base 84 and retained by the adhesive surface 63 of the support 62 when the support 62 was removed from contact with the base 84, as illustrated in FIG. 12.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of preparing at least one discrete conductive form, which comprises:

(a) depositing at least one conductive form on a surface of a base, comprising a valve metal selected from the group consisting of tantalum, niobium, molybdenum and tungsten;

(b) exposing said form-deposited base to a suitable electroplating bath containing a suitable electrode;

(c) charging said form-deposited base negatively with respect to said electrode; and (d) maintaining a current density within said bath ranging (1) up to 250 amps/ft.$^2$ when said base comprises tantalum, (2) up to 200 amps/ft.$^2$ when said base comprises niobium, (3) up to 80 amps/ft.$^2$ when said base comprises molybdenum and (4) up to 68 amps/ft.$^2$ when said base comprises tungsten, to electroplate only upon said at least one discrete conductive form to obtain the desired thickness.

2. The method as defined in claim 1 wherein said valve metal has an oxide thereof on a surface.

3. The method as defined in claim 1 wherein said valve metal has been partially anodized.

4. The method as defined in claim 3 wherein said partially anodized valve metal comprises niobium.

5. The method as defined in claim 3 wherein said base comprises partially anodized tantalum.

6. The method as defined in claim 5 wherein said partially anodized tantalum is anodized to yield a maximum 100 volt oxide film.

7. The method as defined in claim 1 wherein said base comprises a combination of metals, a constituent of which is said valve metal.

8. The method as defined in claim 7 wherein said valve metal constituent has an oxide layer on a surface.

9. The method as defined in claim 7 wherein said valve metal constituent is a major constituent of said combination.

10. The method as defined in claim 1 which further comprises removing said at least one discrete metallic form of the desired thickness from said form-deposited base.

11. The method as defined in claim 10 wherein said removal comprises the steps of:

rendering at least one surface of a background support adhesive, and contacting the top surface areas of said at least one discrete form of the desired thickness with said adhesive surface to (1) remove said form of the desired thickness from said form-deposited base and (2) retain said desired pattern on said adhesive surface.

12. The method as defined in claim 11 wherein said adhesive rendering is attained by applying an adhesive material to at least one surface of said background support.

13. The method as defined in claim 11 wherein said adhesive rendering is attained by heat treating at least one surface of said background material.

14. The method as defined in claim 1 wherein said base is polished.

15. A method of preparing at least one discrete thin film conductive pattern of a desired thickness on an insulative substrate member, which comprises:

(a) depositing at least one discrete thin conductive pattern on a surface of a base comprising a valve metal, capable of conducting electricity during electrodeposition but which is passivated to electrodeposition upon its own surfaces, selected from the group consisting of tantalum, niobium, molybdenum and tungsten;

(b) exposing said pattern-deposited base to a suitable electroplating bath containing a suitable electrode;

(c) charging said pattern-deposited base negatively with respect to said electrode;

(d) maintaining a current density within said bath ranging up to a maximum of (1) 250 amps/ft.$^2$ when said base comprises tantalum, (2) 200 amps/ft.$^2$ when said base comprises niobium, (3) 80 amps/ft.$^2$ when said base comprises molybdenum and (4) 68 amps/ft.$^2$ when said base comprises tungsten, to electroplate only upon said at least one discrete conductive pattern to obtain the desired thickness;

(e) rendering in a tacky condition a surface of an insulative substrate member;

(f) contacting the top surface areas of said pattern of the desired thickness with said tacky surface of said insulative substrate member to (1) remove said pattern of the desired thickness from said pattern-deposited base and (2) retain said at least one discrete conductive pattern on said contacting surface.

16. The method as defined in claim 15 wherein said base comprises a valve metal having an oxide thereof on a surface.

17. The method as claimed in claim 15 wherein said valve metal has been partially anodized.

18. The method as defined in claim 17 wherein said partially anodized valve metal comprises niobium.

19. The method as defined in claim 17 wherein said base comprises partially anodized tantalum.

20. The method as defined in claim 19 wherein said partially anodized tantalum is anodized to yield a maximum 100 volt oxide film.

21. The method as defined in claim 15 wherein said base comprises a combination of metals, a constituent of which is said valve metal.

22. The method as defined in claim 21 wherein said valve metal constituent has an oxide layer thereof on a surface.

23. The method as defined in claim 21 wherein said valve metal constituent is a major constituent of said combination.

24. The method as defined in claim 15 wherein said rendering in a tacky condition is attained by applying an adhesive material to said surface of said insulative substrate.

25. The method as defined in claim 15 wherein said rendering in a tacky condition is attained by heat treating said surface of said insulative substrate.

26. The method as defined in claim 15 wherein said base is polished.

27. A method of electroforming a metallic article, which comprises:

(a) depositing a thin metallic coating on a mandrel, conforming in shape to the article and comprising a valve metal, selected from the group consisting of tantalum, niobium, molybdenum and tungsten, said valve metal being capable of conducting electricity during electrodeposition but which is passivated to electrodeposition upon its own surfaces;

(b) exposing said coated mandrel to a suitable electroplating bath containing a suitable electrode;

(c) charging said coated mandrel negatively with respect to said electrode; and (d) maintaining a current density within said bath ranging up to (1) 250 amps/ft.$^2$ when said mandrel comprises tantalum, (2) 200 amps/ft.$^2$ when said mandrel comprises niobium, (3) 80 amps/ft.$^2$ when said mandrel comprises molybdenum and (4) 68 amps/ft.$^2$ when said mandrel comprises tungsten, to electroplate only upon said thin metallic coat to obtain the desired thickness of the metallic article.

28. The method as defined in claim 27 wherein said valve metal has an oxide thereof on a surface.

29. The method as claimed in claim 27 wherein said valve metal has been partially anodized.

30. The method as defined in claim 29 wherein said mandrel comprises partially anodized tantalum.

31. The method as defined in claim 30 wherein said partially anodized tantalum is anodized to yield a maximum 100 volt oxide film.

32. The method as defined in claim 27 wherein said mandrel comprises a combination of metals, a constituent of which is said valve metal.

33. The method as defined in claim 32 wherein said valve metal constituent has an oxide layer on a surface.

34. The method as defined in claim 32 wherein said valve metal constituent is a major constituent of said combination.

35. The method as defined in claim 27 wherein said mandrel is polished.

36. A method of preparing at least one discrete conductive form, which comprises:

(a) depositing at least one conductive form on a surface of a base comprising tantalum, said tantalum base being capable of conducting electricity during electrodeposition but which is passivated to electrodeposition upon its own surfaces;

(b) exposing said form-deposited base to a suitable electroplating bath containing a suitable electrode;

(c) charging said form-deposited base negatively with respect to said electrode; and (d) maintaining a sufficient current density within said bath ranging up to 250 amps/ft.$^2$ to electroplate only upon said at least one discrete conductive form to obtain the desired thickness.

37. A method of preparing at least one discrete conductive form, which comprises:

(a) depositing at least one conductive form on a surface of a base comprising niobium, said niobium base being capable of conducting electricity during electrodeposition but which is passivated to electrodeposition upon its own surfaces;

(b) exposing said form-deposited base to a suitable electroplating bath containing a suitable electrode;

(c) charging said form-deposited base negatively with respect to said electrode; and (d) maintaining a sufficient current density within said bath ranging up to 200 amps/ft.$^2$ to electroplate only upon said at least one discrete conductive form to obtain the desired thickness.

38. A method of preparing at least one dsicrete conductive form, which comprises:

(a) depositing at least one conductive form on a surface of a base comprising molybdenum, said molybdenum base being capable of conducting electricity during electrodeposition but which is passivated to electrodeposition upon its own surfaces;

(b) exposing said form-deposited base to a suitable electroplating bath containing a suitable electrode;

(c) charging said form-deposited base negatively with respect to said electrode; and (d) maintaining a sufficient current density within said bath ranging up to 80 amps/ft.$^2$ to electroplate only upon said at least one discrete conductive form to obtain the desired thickness.

39. A method of preparing at least one discrete conductive form, which comprises:

(a) depositing at least one conductive form on a surface of a base comprising tungsten, said tungsten base being capable of conducting electricity during electrodeposition but which is passivated to electrodeposition upon its own surfaces;

(b) exposing said form-deposited base to a suitable electroplating bath containing a suitable electrode;

(c) charging said form-deposited base negatively with respect to said electrode; and (d) maintaining a sufficient current density within said bath ranging up to 68 amps/ft.$^2$ to electroplate only upon said at least one discrete conductive form to obtain the desired thickness.

40. A method of electroforming a metallic article, which comprises:

(a) depositing a thin metallic coating on a mandrel, conforming in shape to the article and comprising tantalum, said tantalum mandrel being capable of conducting electricity during electrodeposition but which is passivated to electrodeposition upon its own surfaces;

(b) exposing said coated mandrel to a suitable electroplating bath containing a suitable electrode;

(c) charging said coated mandrel negatively with respect to said electrode; and (d) maintaining a sufficient current density within said bath ranging up to 250 amps/ft.$^2$ to electroplate only upon said thin metallic coat to obtain the desired thickness of the metallic article.

41. A method of electroforming a metallic article, which comprises:

(a) depositing a thin metallic coating on a mandrel, conforming in shape to the article and comprising niobium, said niobium mandrel being capable of conducting electricity during electrodeposition but which is passivated to electrodeposition upon its own surfaces;

(b) exposing said coated mandrel to a suitable electroplating bath containing a suitable electrode;

(c) charging said coated mandrel negatively with respect to said electrode; and (d) maintaining a sufficient current density within said bath ranging up to 200 amps/ft.$^2$ to electroplate only upon said thin metallic coat to obtain the desired thickness of the metallic article.

42. A method of electroforming a metallic article, which comprises:

(a) depositing a thin metallic coating upon a mandrel, conforming in shape to the article and comprising molybdenum, said molybdenum mandrel being capable of conducting electricity during electrodeposition but which is passivated to electrodeposition upon its own surfaces;

(b) exposing said coated mandrel to a suitable electroplating bath containing a suitable electrode;

(c) charging said coated mandrel negatively with respect to said electrode; and (d) maintaining a sufficient current density within said bath ranging up to 80 amps/ft.$^2$ to electroplate only upon said thin metallic coat to obtain the desired thickness of the metallic article.

43. A method of electroforming a metallic article, which comprises:

(a) depositing a thin metallic coating on a mandrel, conforming in shape to the article and comprising tungsten, said tungsten mandrel being capable of conducting electricity during electrodeposition but which is passivated to electrodeposition upon its own surfaces;

(b) exposing said coated mandrel to a suitable electroplating bath containing a suitable electrode;

(c) charging said coated mandrel negatively with respect to said electrode; and (d) maintaining a sufficient current density within said bath ranging up to 68 amps/ft.$^2$ to electroplate only upon said thin metallic coat to obtain the desired thickness of the metallic article.

44. The method as defined in claim 29 wherein said mandrel comprises partially anodized niobium.

References Cited

UNITED STATES PATENTS

| | | | |
|---|---|---|---|
| 1,750,418 | 3/1930 | McFarland | 204—18 R |
| 1,857,929 | 5/1932 | McFarland | 204—18 R |
| 2,367,314 | 1/1945 | Russell | 204—15 |
| 3,463,707 | 8/1969 | Gibson et al. | 204—290 F |
| 3,202,591 | 8/1965 | Curran | 204—38 |
| 2,874,085 | 2/1959 | Brietzke | 204—12 |
| 2,646,396 | 7/1953 | Dean | 204—12 |
| 3,388,048 | 6/1968 | Szabo | 204—15 |
| 2,708,181 | 5/1955 | Holmes | 204—28 |

FOREIGN PATENTS

| | | | |
|---|---|---|---|
| 18,737 | 8/1964 | Germany | 204—297 R |
| 676,575 | 6/1939 | Germany | 204—297 R |
| 1,007,662 | 10/1965 | Great Britain | 204—15 |
| 897,416 | 5/1944 | France. | |

JOHN H. MACK, Primary Examiner

T. TUFARIELLO, Assistant Examiner

U.S. Cl. X.R.

204—11, 15, 281, 290 F